(12) United States Patent
Prajuckamol et al.

(10) Patent No.: US 7,736,951 B2
(45) Date of Patent: Jun. 15, 2010

(54) CIRCUIT COMPONENT AND METHOD OF MANUFACTURE

(75) Inventors: Atapol Prajuckamol, Rayong (TH); Chee Hiong Chew, Seremban (MY); Khiengkrai Khusuwan, Bangkok (TH)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 331 days.

(21) Appl. No.: 11/768,558

(22) Filed: Jun. 26, 2007

(65) Prior Publication Data
US 2008/0224278 A1    Sep. 18, 2008

(30) Foreign Application Priority Data
Mar. 15, 2007    (MY)  ............... PI 20070410

(51) Int. Cl.
*H01L 21/00* (2006.01)
(52) U.S. Cl. .................... 438/111; 438/123
(58) Field of Classification Search .......... 438/111, 438/123; 257/E21.51
See application file for complete search history.

(56) References Cited

U.S. PATENT DOCUMENTS

| | | | |
|---|---|---|---|
| 5,428,245 A * | 6/1995 | Lin et al. ................ | 257/666 |
| 5,442,228 A * | 8/1995 | Pham et al. ............. | 257/659 |
| 5,839,184 A * | 11/1998 | Ho et al. ................. | 29/605 |
| 6,180,433 B1 * | 1/2001 | Furey et al. ............. | 438/106 |
| 6,608,367 B1 * | 8/2003 | Gibson et al. ........... | 257/666 |
| 6,621,140 B1 * | 9/2003 | Gibson et al. ........... | 257/531 |
| 6,713,317 B2 * | 3/2004 | Knapp et al. ............ | 438/106 |
| 6,765,284 B2 * | 7/2004 | Gibson et al. ........... | 257/666 |
| 6,927,481 B2 * | 8/2005 | Gibson et al. ........... | 257/666 |
| 7,005,325 B2 * | 2/2006 | Chow et al. ............. | 438/123 |
| 7,250,685 B2 * | 7/2007 | Shim et al. .............. | 257/778 |
| 7,414,318 B2 * | 8/2008 | Shim et al. .............. | 257/778 |
| 7,445,967 B2 * | 11/2008 | Abdo et al. .............. | 438/123 |
| 7,531,893 B2 * | 5/2009 | Koduri ..................... | 257/676 |
| 7,575,957 B2 * | 8/2009 | Huang et al. ............ | 438/123 |
| 2005/0263863 A1 * | 12/2005 | Sasaki et al. ........... | 257/676 |
| 2008/0211068 A1 * | 9/2008 | Chen et al. .............. | 257/666 |
| 2009/0004774 A1 * | 1/2009 | Lee et al. ................. | 438/107 |
| 2009/0160595 A1 * | 6/2009 | Feng et al. .............. | 336/200 |

* cited by examiner

Primary Examiner—David A Zarneke
(74) Attorney, Agent, or Firm—Rennie William Dover

(57) ABSTRACT

An inductor, a semiconductor component including the inductor, and a method of manufacture. A leadframe has a plurality of conductive strips and a flag. A ferrite core is mounted on a die attach material disposed on the conductive strips and a semiconductor die is mounted on a die attach material disposed on the flag. Wire bonds are formed from the conductive strips on one side of the ferrite core to corresponding conductive strips on an opposing side of the ferrite core. The wire bonds and the conductive strips cooperate to form the coil of the inductor. Wire bonds electrically couple one end of the inductor to leadframe leads adjacent the semiconductor die. Wire bonds couple bond pads on the semiconductor die to the leadframe leads coupled to the inductor. An encapsulant is formed around the inductor and the semiconductor die. Alternatively, a stand-alone inductor is manufactured.

18 Claims, 4 Drawing Sheets

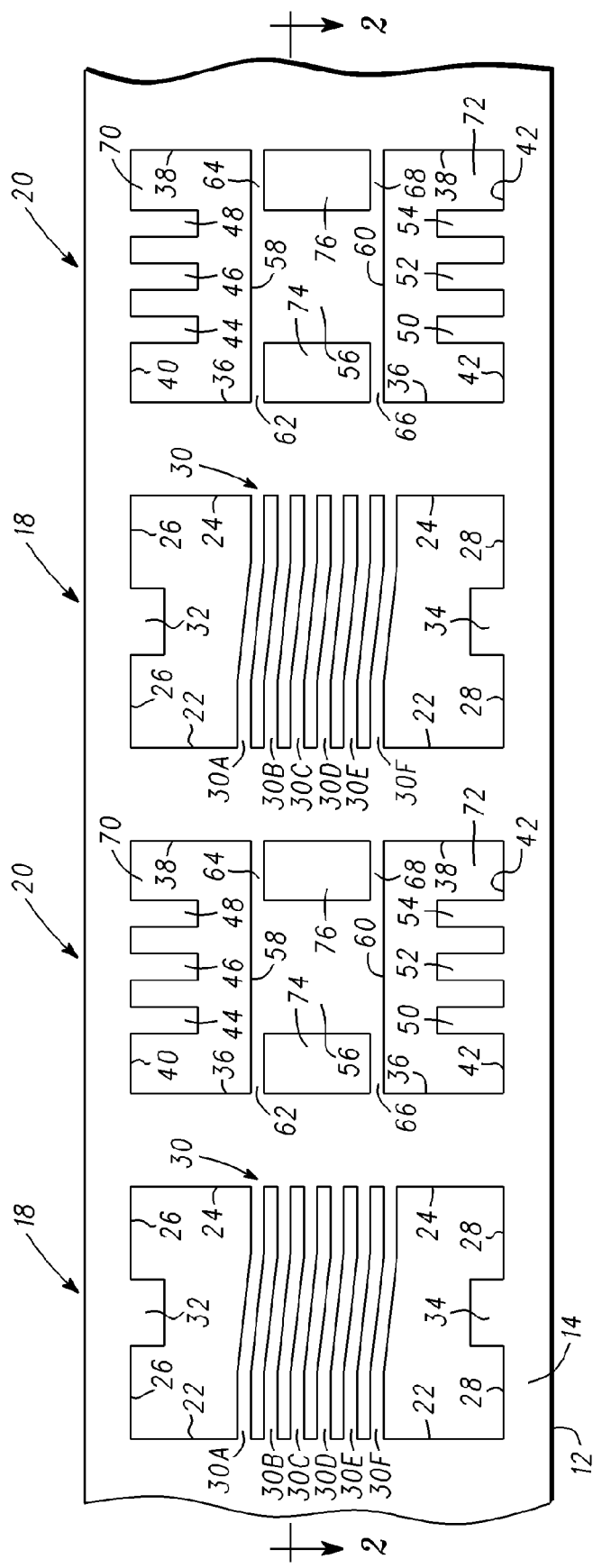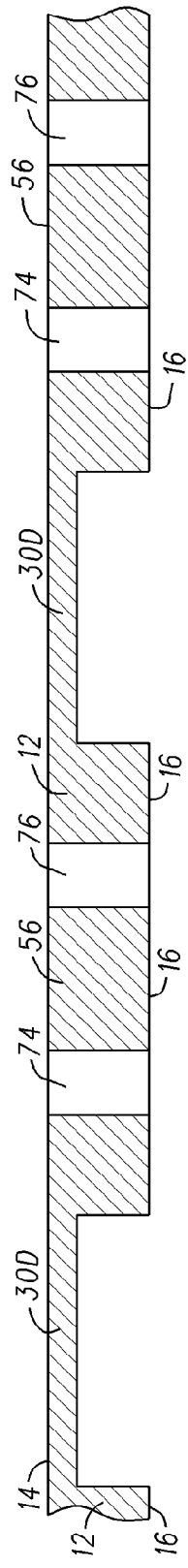

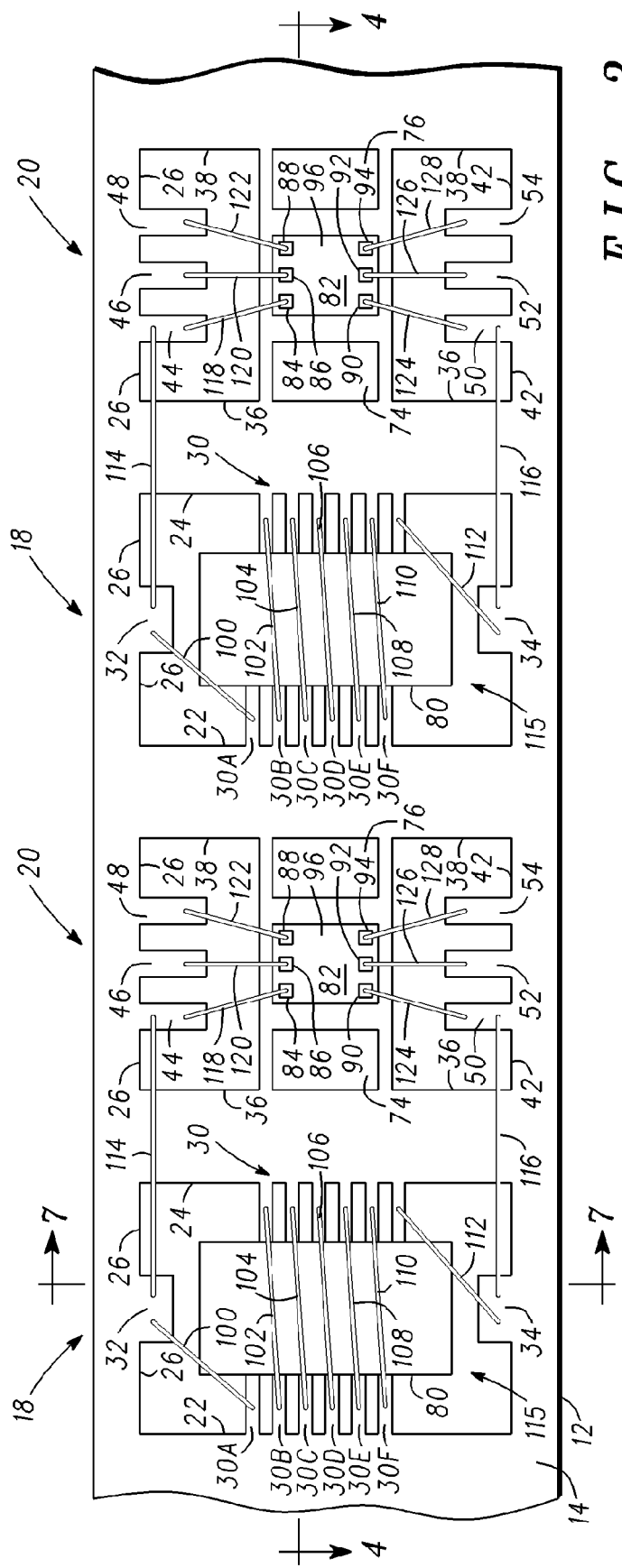

CIRCUIT COMPONENT AND METHOD OF MANUFACTURE

FIELD OF THE INVENTION

The present invention relates, in general, to a semiconductor component and, more particularly, to a semiconductor component including a passive circuit element.

BACKGROUND OF THE INVENTION

Semiconductor component manufacturers are constantly striving to increase the functionality and performance of their products while decreasing their cost of manufacture. One approach for increasing functionality and performance has been to integrate passive circuit elements with active circuit elements in a semiconductor substrate. However, a passive circuit element such as an inductor occupies a large region of the semiconductor substrate. Thus, integrating an inductor with an active device increases the cost of semiconductor components composed of passive and active circuit elements. Another approach has been to couple a passive circuit element to an active circuit element on a printed circuit board substrate. This approach uses complex input and output interconnect structures. In both of these approaches, the cost of manufacturing the passive circuit elements increases the cost of the semiconductor component.

Thus, it would be advantageous to have a passive circuit element such as, for example, an inductor and a method for manufacturing the passive circuit element that is cost efficient and suitable for coupling with a semiconductor die.

BRIEF DESCRIPTION OF THE DRAWINGS

The present invention will be better understood from a reading of the following detailed description, taken in conjunction with the accompanying drawing figures in which like reference characters designate like elements and in which:

FIG. 1 is a top view of a leadframe used in the manufacture of a semiconductor component in accordance with an embodiment of the present invention;

FIG. 2 is a cross-sectional view of the leadframe of FIG. 1 taken along section line 2-2;

FIG. 3 is top view of the leadframe of FIGS. 1 and 2 on which inductors and semiconductor dice are formed in accordance with an embodiment of the present invention;

FIG. 4 is a cross-sectional view of the leadframe, inductors, and semiconductor dice of FIG. 3 taken along section line 4-4;

DETAILED DESCRIPTION

Figure 5:
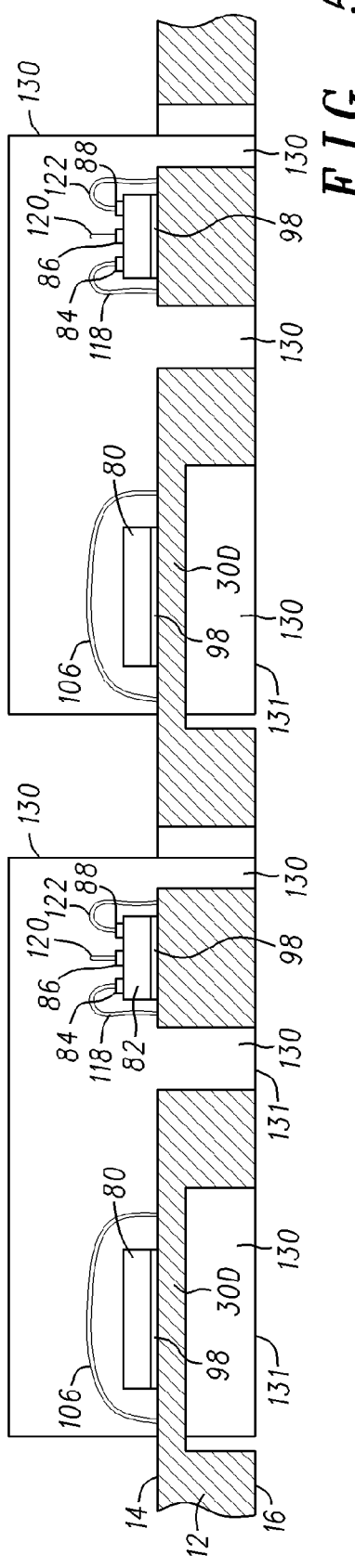
FIG. 5 is cross-sectional view of the leadframe, inductors, and semiconductor dice of FIG. 4 at a later stage of manufacture.

Generally, the present invention provides an inductor and semiconductor components comprising the inductor and a method for manufacturing the inductor and the semiconductor components. In accordance with an embodiment of the present invention, the inductor comprises a portion of a leadframe, an inductor core, and wire bonds coupled to the leadframe, wherein the wire bonds and the portion of the leadframe cooperate to form the windings of the inductor. Preferably, the inductor core is a ferrite core.

In accordance with another embodiment of the present invention, the inductor is electrically coupled to a semiconductor die. The inductor and the semiconductor die are encapsulated in a mold compound. It should be noted that a semiconductor die is also referred to as a semiconductor chip and semiconductor dice are also referred to as semiconductor chips.

FIGS. 1 and 2 illustrate a semiconductor component 10 in accordance with an embodiment of the present invention. FIG. 1 is a top view of a portion of a leadframe 12 used in the manufacture of semiconductor component 10 and FIG. 2 is a cross-sectional view of leadframe 12 taken along section line 2-2 of FIG. 1. Leadframe 12 has top and bottom surfaces 14 and 16 and passive and active device regions 18 and 20, respectively. Bottom surface 16 is shown in FIG. 2. Each passive device region 18 includes an opening having opposing sides 22 and 24 and sides 26 and 28. A plurality of conductive strips 30 extends from side 22 to side 24. FIG. 1 illustrates six conductive strips 30A, 30B, 30C, 30D, 30E, and 30F in each passive device region 18. It should be understood that the number of conductive strips is not a limitation of the present invention. Thus, there can be more or fewer than six conductive strips. Leadframe leads 32 and 34 extend from sides 26 and 28, respectively, into the opening in passive device region 18.

Each active device region 20 includes openings having opposing sides 36 and 38 and sides 40 and 42. Leadframe leads 44, 46, and 48 extend from each side 40 into opening 70 and leadframe leads 50, 52, and 54 extend from each side 42 into opening 72. Active device region 20 further includes a flag or die attach region 56 having opposing sides 58 and 60 and tabs 62, 64, 66, and 68. An opening 70 is formed between sides 40 and 58 and between sides 36 and 38 and an opening 72 is formed between sides 42 and 60 and between sides 36 and 38. In addition, an opening 74 is formed adjacent to flag 56 and between tabs 62 and 64 and an opening 76 is formed adjacent to flag 56 and between tabs 64 and 68. By way of example, leadframe 12 is a copper leadframe. Techniques for manufacturing leadframes such as leadframe 12 are known to those skilled in the art.

FIG. 2 further illustrates surfaces 14 and 16, conductive strips 30D, flags 56, and openings 74 and 76 of leadframe 12.

FIG. 3 is a top view of leadframe 12 at a later stage of manufacture in which an inductor core 80 is mounted over conductive strips 30A-30F in passive device region 18 and a semiconductor die 82 is mounted over flag 56 in active device region 20. Preferably, inductor core 80 is a ferrite core. FIG. 4 is a cross-sectional view of leadframe 12, inductor cores 80, and semiconductor dice 82 taken along section line 4-4 of FIG. 3. For the sake of clarity, FIGS. 3 and 4 are described together. Each semiconductor die 82 has bond pads 84, 86, 88, 90, 92, and 94 disposed on their top surfaces 96. Die attach material 98 may be deposited on conductive strips 30A-30F and flags 56. Suitable die attach materials include ABLESTIK 8006NS, ABLESTIK 8900NC, or the like. These exemplary die attach materials are manufactured by Ablestik Laboratories of Rancho Dominguez, Calif., a division of National Starch and Chemical Company, Inc. ABLESTIK is a trademark of Ablestik Laboratories. The type of die attach material is not limited to being a material manufactured by Ablestik Laboratories. In accordance with one embodiment, die attach material 98 is dispensed on conductive strips 30A-30F and on flags 56. A ferrite core 80 is placed in the die attach material 98 disposed on each set of conductive strips 30A-30D and a semiconductor die 82 is placed in the die attach material 98 disposed on each flag 56. Die attach material 98 is cured by heating it in a nitrogen ambient at a temperature ranging from about 165 degrees Celsius (° C.) to about 175° C. In an alternative embodiment, the die attach material is printed on ferrite core 80 and on semiconductor die 82.

A bond wire 100 is formed from the end of conductive strip 30A that is adjacent side 22 to leadframe lead 32. Preferably bond wire 100 crosses over and is vertically spaced apart from ferrite core 80. A bond wire 102 is formed from the end of conductive strip 30B that is adjacent to side 22 across ferrite core 80 to the end of conductive strip 30A that is adjacent to side 24. A bond wire 104 is formed from the end of conductive strip 30C that is adjacent to side 22 across ferrite core 80 to the end of conductive strip 30B that is adjacent to side 24. A bond wire 106 is formed from the end of conductive strip 30D that is adjacent to side 22 across ferrite core 80 to the end of conductive strip 30C that is adjacent to side 24. A bond wire 108 is formed from the end of conductive strip 30E that is adjacent to side 22 across ferrite core 80 to the end of conductive strip 30D that is adjacent to side 24. A bond wire 110 is formed from the end of conductive strip 30F that is adjacent to side 22 across ferrite core 80 to the end of conductive strip 30E that is adjacent to side 24. A bond wire 112 is formed from leadframe lead 34 to the end of conductive strip 30F that is adjacent to side 24. Preferably, bond wire 112 crosses over and is vertically spaced apart from a portion of ferrite core 80. Bond wires 102-112 are vertically spaced apart from ferrite core 80. Bondwires 102-112 cooperate with conductive strips 30A-30F and ferrite core 80 to form an inductor 115.

A bond wire 114 is formed from leadframe lead 32 to leadframe lead 44 and a bond wire 116 is formed from leadframe lead 34 to leadframe lead 50. It should be noted that in embodiments in which a semiconductor component is absent, bond wires 114 and 116 are not formed.

Bond pads 84-94 are electrically coupled to leadframe leads 44-54 by bond wires 118, 120, 122, 124, 126, and 128, respectively.

Referring now to FIG. 5, an encapsulant 130 is formed around ferrite cores 80, semiconductor dice 82, bond wires 102-128, and portions of leadframe 12. Encapsulant 130 has a bottom surface 131. By way of example, encapsulant 130 is a mold compound that is formed using an injection molding process. Preferably, mold compound 130 is a packaging material that forms a package body.

Figure 6:
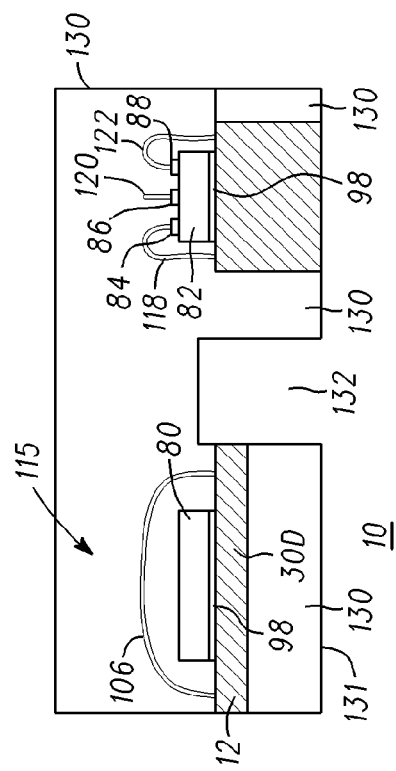
FIG. 6 is a cross-sectional view of a semiconductor component singulated from the leadframe of FIG. 5.

Referring now to FIG. 6, grooves 132 are cut into the portions of leadframe 12 and mold compound 130 that are between ferrite cores 80 and semiconductor dice 82. Grooves 132 electrically isolate the portions of leadframe 12 supporting ferrite cores 80 from the portions of leadframe 12 supporting semiconductor dice 82. It should be noted that the grooves are formed between ferrite cores 80 that are electrically connected to semiconductor dice 82 by bond wires 114 and 1 16. In addition, individual semiconductor components 10 are singulated from leadframe 12. Each semiconductor component 10 includes an inductor 115 electrically connected to a semiconductor die 82 by bond wires 114 and 116.

Figure 7:
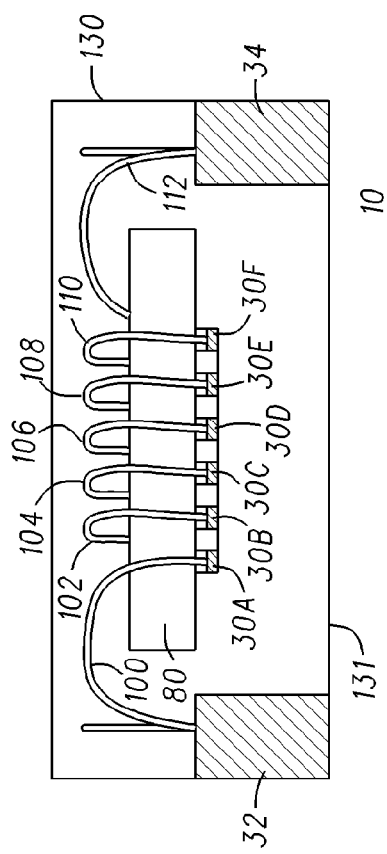
FIG. 7 is a cross-sectional view of the semiconductor component of FIG. 6 taken along section line 7-7 of FIG. 3.

FIG. 7 is a cross-sectional view of inductor 115 of semiconductor component 10 taken along the region of section line 7-7 of FIG. 3. The cross-sectional view of FIG. 7 is at a later step in the manufacturing process than that shown in FIG. 3. What is shown in FIG. 7 is ferrite core 80 mounted to conductive strips 30A-30F and bond wires 100-112 wire bonded to conductive strips 30A-30F and to leadframe leads 32 and 34. Ferrite core 80, conductive strips 30A-30F, and leadframe leads 32 and 34 are in encapsulant 130.

Figure 8:
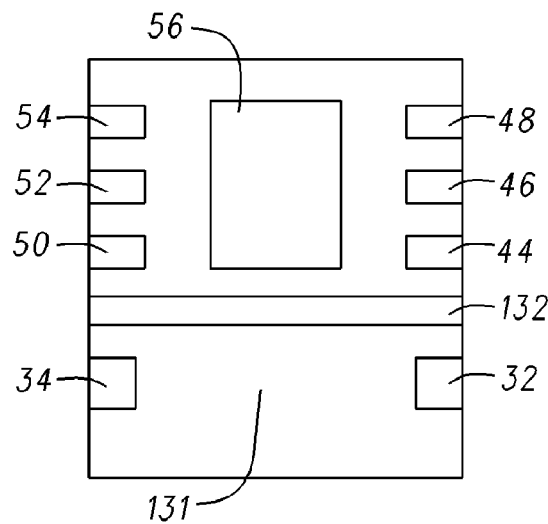
FIG. 8 is a bottom view of the semiconductor component of FIG. 6.

FIG. 8 is a bottom view of semiconductor component 10. What is shown in FIG. 8 is leadframe leads 44-54, leadframe leads 32 and 34, flag 56, groove 132, and bottom portion 131 of encapsulant 130.

Figure 9:
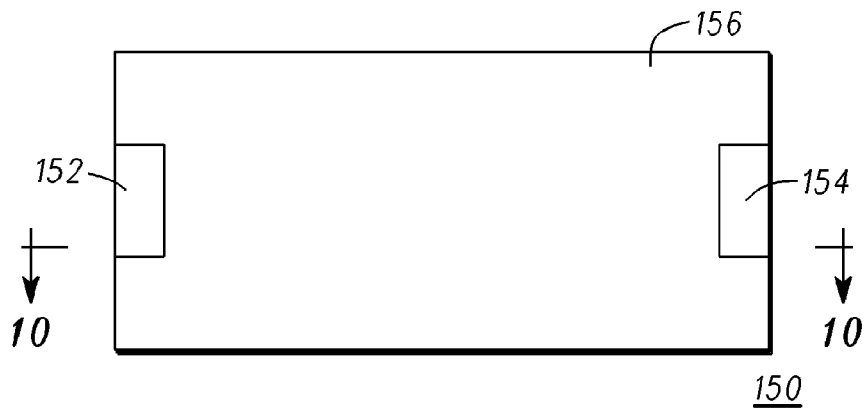
FIG. 9 is a bottom view of an inductor in accordance with another embodiment of the present invention.
Figure 10:
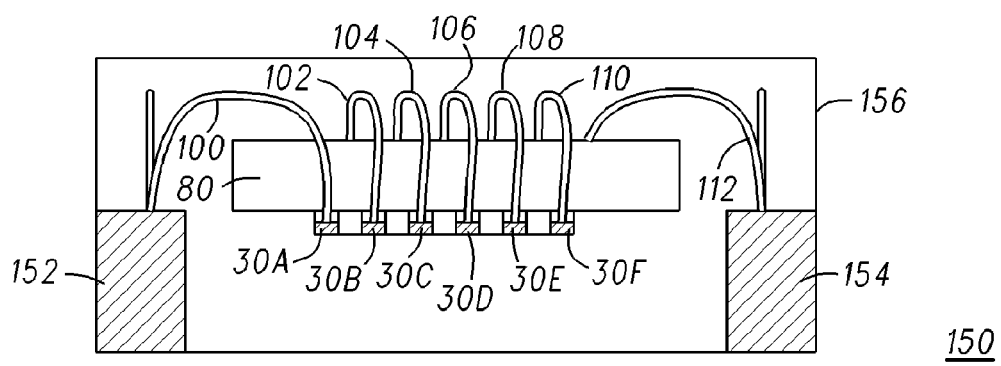
FIG. 10 is a cross-sectional view of the inductor of FIG. 9 taken along section line 10-10.

FIG. 9 is a bottom view of an inductor 150 in accordance with another embodiment of the present invention. Inductor 150 has leads 152 and 154. Preferably, mold compound 156 is a packaging material that forms a package body. FIG. 10 is a cross-sectional view of inductor 150 taken along section line 10-10 of FIG. 9. Inductor 150 is similar to inductor 115 shown in FIGS. 3-8 except that the reference characters identifying leadframe leads 32 and 34 have been changed to reference characters 152 and 154, respectively, in FIGS. 9 and 10. Thus inductor 150 includes a ferrite core 80 mounted to conductive strips 30A-30F, and bond wires 100-112 wire bonded to conductive strips 30A-30F and to leadframe leads 152 and 154. However, inductor 150 is made from a leadframe that differs from leadframe 12 because active device regions 20 are replaced by additional passive device regions 18. In other words, active device regions 20 are absent from leadframe 12.

By now it should be appreciated that an inductor and a semiconductor component comprising an inductor and at least one semiconductor die and a method for manufacturing the inductor and the semiconductor component have been provided. An advantage of manufacturing the inductor by using a portion of a leadframe as its coil is that it reduces manufacturing complexity and lowers costs.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:

providing a leadframe having an active device portion and a passive device portion, wherein the passive device portion of the leadframe includes a plurality of conductive strips, and wherein each conductive strip of the plurality of conductive strips has a first end and a second end;

coupling an inductor core to the passive device portion of the leadframe;

coupling a semiconductor die to the active device portion of the leadframe;

providing a plurality of bond wires; and coupling a bond wire from the first end of one conductive strip to the second end of another conductive strip.

2. The method of claim 1, further including encapsulating the passive device portion and the active device portion.

3. The method of claim 1, further including separating the portion of the leadframe between the passive device portion and the active device portion.

4. The method of claim 1, wherein providing the leadframe includes providing at least four conductive strips and wherein providing the plurality of wire bonds includes providing at least four wire bonds.

5. The method of claim 4, further including:

bonding a second end of a first bond wire to a first end of a first conductive strip;

bonding a first end of a second bond wire to a second end of the first conductive strip;
bonding a second end of the second bond wire to a first end of a second conductive strip;
bonding a first end of a third bond wire to a second end of the second conductive strip;
bonding a second end of the third bond wire to a first end of a third conductive strip;
bonding a first end of a fourth bond wire to a second end of the third conductive strip; and
bonding a second end of the fourth bond wire to a first end to a fourth conductive strip.

6. The method of claim 5, wherein providing the leadframe includes providing the leadframe to have first and second leadframe leads in the active device portion and first and second leadframe leads in the passive device portion, and further including:
bonding the first end of the first bond wire to the first leadframe lead in the passive device region;
coupling the first leadframe lead in the passive device region to the first leadframe lead in the active device region;
coupling the second leadframe lead in the active device region to the semiconductor die;
coupling the second leadframe lead in the passive device region to the second leadframe lead in the active device region; and
coupling the second leadframe lead in the active device region to the semiconductor die.

7. The method of claim 6, further including:
bonding a first end of a fifth bond wire to a second end of the fourth conductive strip;
bonding a second end of the fifth bond wire to a first end of a fifth conductive strip;
bonding a first end of a sixth bond wire to a second end of the fifth conductive strip;
bonding a second end of the sixth bond wire to a first end to a sixth conductive strip; and
bonding first end of a seventh bond wire to first leadframe lead in the passive device region.

8. A method for manufacturing a semiconductor component, comprising:
providing a leadframe having an active device portion and a passive device portion, wherein the passive device portion of the leadframe includes a plurality of conductive strips, and wherein each conductive strip of the plurality of conductive strips has a first end and a second end, and wherein providing the leadframe includes
providing the leadframe to have first and second leadframe leads in the active device portion and first and second leadframe leads in the passive device portion, and further including:
coupling a first conductive strip of the plurality of conductive strips to the first leadframe lead in the passive device region;
coupling the first leadframe lead in the passive device region to the first leadframe lead in the active device region;
coupling the first and second leadframe leads in the active device region to the semiconductor die;
coupling a second conductive strip of the plurality of conductive strips to the second leadframe lead in the passive device region;
coupling the second leadframe lead in the passive device region to the second leadframe lead in the active device region;
coupling the second leadframe lead in the active device region to the semiconductor die;
coupling an inductor core to the passive device portion of the leadframe; and
coupling a semiconductor die to the active device portion of the leadframe.

9. The method of claim 1, wherein coupling the inductor core to the passive device portion includes coupling a ferrite core to the passive device portion.

10. A method for manufacturing an inductor, comprising:
providing a leadframe having a first winding that has first and second portions, the first portion of the first winding having first and second ends and the second portion of the first winding having first and second ends;
coupling an inductor core to the first portion of the first winding; and
coupling the second end of the second portion of the first winding to the first end of the first portion of the first winding.

11. The method of claim 10, wherein coupling the second end of the second portion of the first winding to the first end of the first portion comprises:
providing a conductor having first and second ends; and
coupling the second end of the conductor to the first end of the first portion of the first winding.

12. The method of claim 10, wherein providing the conductor includes providing a bond wire.

13. The method of claim 10, wherein providing the leadframe further includes coupling a first portion of a second winding between the first and second opposing sides, the first portion of the second winding having first and second ends and spaced apart from the first portion of the first winding.

14. The method of claim 13, further including coupling a first end of a second portion of the second winding to the second end of the first portion of the second winding.

15. The method of claim 14, further including forming an encapsulant around the inductor core, the first and second portions of the first winding, and the first and second portions of the second winding.

16. A method for manufacturing an inductor, comprising:
providing a leadframe having first and second opposing sides and first portions of a plurality of windings extending from the first opposing side to the second opposing side, the first portions of the plurality of windings each having first and second ends;
coupling an inductor core to the first portions of the plurality of windings;
providing second portions of the plurality of windings, the second portions each having first and second ends; and
coupling the second end of the second portion of a first winding of the plurality of windings to the first end of the first portion of the first winding.

17. The method of claim 16, further including providing the leadframe having at least six windings, wherein each winding has first and second portions, and further including
coupling a first end of a second portion of a second winding to the second end of the first portion of the first winding;
coupling a second end of the second portion of a second winding to the first end of the first portion of the second winding;
coupling a first end of a second portion of a third winding to the first end of the first portion of the second winding;
coupling a second end of the second portion of a third winding to the first end of the first portion of the third winding;
coupling a first end of a second portion of the third winding to the first end of the first portion of the third winding;

coupling a second end of the second portion of a third winding to the first end of the first portion of a fourth winding;

coupling the first end of the second portion of the fourth winding to the first end of the first portion of the fourth winding;

coupling the second end of the second portion of a fifth winding to the first end of the first portion of a fifth winding; and coupling the first end of the second portion of the fifth winding to the first end of the first portion of a sixth winding.

18. The method of claim 16, wherein the inductor core has first and second surfaces, the first surface adjacent to the leadframe.

* * * * *